United States Patent [19]

Rötzer

[11] Patent Number: 4,718,593

[45] Date of Patent: Jan. 12, 1988

[54] METHOD OF FORMING ALLOYED METAL CONTACTS ON ROUGH SAW-DAMAGED SILICON SURFACES

[76] Inventor: Gunther Rötzer, Apartado 161, Cumaná, Venezuela

[21] Appl. No.: 920,575

[22] Filed: Oct. 17, 1986

[51] Int. Cl.$^4$ .............................................. B23K 31/02
[52] U.S. Cl. .................................. 228/123; 228/263.11
[58] Field of Search ........... 228/123, 219, 122, 263.12, 228/263.11

[56] References Cited

U.S. PATENT DOCUMENTS

| | | | |
|---|---|---|---|
| 3,510,157 | 5/1970 | Rubin | 228/219 |
| 3,941,916 | 3/1976 | Morse | 228/122 |
| 4,110,783 | 8/1978 | Onodera et al. | 357/67 |

FOREIGN PATENT DOCUMENTS 1468973  3/1977  United Kingdom ................ 228/122

OTHER PUBLICATIONS

T. S. Kuan, et al., "Effect of Luricant Environments on Saw Damage in Si Wafers", Journal Electrochemical Society: Solid State Science and Technology, vol. 127, No. 6, pp. 1387-1394, (Jun. 1980).

*Primary Examiner*—Nicholas P. Godici
*Assistant Examiner*—Karen Skillman
*Attorney, Agent, or Firm*—Phillips, Moore, Lempio & Finley

[57] ABSTRACT

The present invention relates to an improved method for the permanent bonding of a metal to a rough cut and unmodified semiconductor material, which comprises (a) contacting the surface of (i) the semiconductor material in an inert atmosphere at elevated temperature where the semiconductor surface is rough cut usually with a diamond saw and is not subsequently treated further, with (ii) a metal electrode wherein the surface of the metal electrode comprises (iii) a solder itself comprising between about 10–90% by weight of palladium and about 10–90% by weight of silver, and (b) the soldered semiconductor metal joint is cooled in an inert atmosphere to ambient temperature. Preferably, a silicon surface and tungsten electrode are joined at between about 800° and 1300° C. using a solder comprising about 24.8 to 37.2 mg of palladium and 43.2 to 64.8 mg of silver per square centimeter to be covered of the silicon surface. In the process, the rough surface of the silicon does not need to be specially treated, thus resulting in an increase in efficiency and a decrease in cost.

17 Claims, 1 Drawing Figure

METHOD OF FORMING ALLOYED METAL CONTACTS ON ROUGH SAW-DAMAGED SILICON SURFACES

BACKGROUND OF THE INVENTION

1. Field of the Invention

The present invention relates to a method of forming a metal-semiconductor contact. More particularly, the invention relates to a method of contacting a semiconductor, such as silicon, which has been rough-cut using, for instance, a water-cooled diamond saw and a metal, such as tungsten, using a novel solder layer. Specifically, the invention involves the contact and bonding of a rough cut silicon to tungsten using a solder comprising palladium and silver.

2. Background of the Invention

The problems related to the permanent bonding of a metal electrode and a semiconductor material using a solder composition have been known for some time. For instance, H. Onodera et al., disclose in U.S. Pat. No. 4,110,783, the manufacture of a semiconductor device comprising a silicon body having an exposed surface of N-type conductivity layer and a substrate bonded to the exposed surface by means of a layer of a novel solder material. The solder material is an alloy consisting essentially of 2-12% by weight of at least one element of Group V of the Periodic Table, preferably antimony, and 0.01-5% by weight of at least one of the rare earth elements, for example Misch metal (containing lanthanum and cerium) and aluminum being the balance on the basis of total weight of the solder material. An increase in forward voltage drop (FVD) of the device in which a conventional aluminum solder is used is prevented by the use of the new solder materials.

In U.S. Pat. No. 4,476,375, Ogawa discloses a method for cutting an electrical conductive layer having a heat-absorbing film deposited thereon by irradiating an energy beam on a portion of the electrical conductive layer intended to be cut. The energy beam is irradiated on the film, whereby the portion of the electrical conductive layer melts and alloys with the heat absorbing film due to the energy absorbed and transferred by the heat absorbing film. The selective cutting electrical conduction layers using a laser and melting of a metallic circuit using excess current are also disclosed.

A general discussion by G. Sistare, et al., on "Solders and Brazing Alloys" is found in the *Kirk-Othmer: Encyclopedia of Chemical Technology*, (3rd ed.), Vol. 21, p. 342-355, published in 1983 and also "Silver and Silver Alloys" on pages 1-15.

Contact formation on a semiconductor substrate is usually obtained by means of a deposition of a metal and sintering at high temperatures. Contact formation also occurs by means of alloying done during semiconductor device fabrication only after several involved steps are followed for preparation of the surface of the substrate in the contact area. These steps are performed in order to obtain a series of properties on the surface of the substrate in the contact area, including, for example:

1. A lack of or low density of crystal defects which degrade the electrical properties of the contact and which are produced when the substrate is cut by a water cooled diamond saw at the surface where the contact is to be formed.
2. The absence of a native oxide layer, which in all but the metal-insulator-semiconductor (MIS) devices is not desired in metal-semiconductor contacts, neither of ohmic nor rectifying types.
3. A fairly flat surface of the substrate in the contact area in order to achieve a reproduceable current density distribution in the contact area.

It is common practice in the art to perform several process steps to obtain the above cited properties. The process steps in current technology include, for example, grinding, chemical polishing, chemical etching, reactive plasma etching or the like are expensive and time consuming. In the case of the use of chemical agents, such as highly toxic and extremely reactive nitric acid or hydrogen fluoride, special precautions are needed to protect the surroundings and the personnel from contact and contamination. These process steps are time consuming, and in some cases hazardous, and detract from the efficiency of manufacturing semiconductors.

It is therefore very valuable to decrease the number of process steps in the fabrication of a semiconductor device. It is also important to eliminate, if possible, the need to use hazardous agents in chemical polishing and etching. These objectives are accomplished in the present invention by elimination of all of the above cited steps for preparation of the surface of the substrate in the area where the alloyed contact will be formed.

SUMMARY OF THE INVENTION

The present invention relates to an improved method for permanent bonding of a metal to a rough cut and unmodified semiconductor material, which method comprises:

(a) contacting the surface of the semiconductor material in an inert atmosphere between about 800° and 1300° C. wherein said surface is rough cut and is not subsequently treated further, with a metal electrode wherein the surface of said metal electrode comprises a solder itself comprising between about 10 to 90 percent by weight of palladium and about 10 to 90 percent by weight of silver;

(b) creating a solid contact; and (c) cooling the soldered contact in inert atmosphere to ambient temperature.

In a preferred embodiment, the elevated temperature in step (a) is between about 1000° and 1100° C., especially about 1024° C.

In a preferred embodiment, the palladium and silver as a solder mixture comprise palladium in between about 24.8 to 37.2 mg per square centimeter of metal electrode surface and silver is between about 43.2 and 64.8 mg per square centimeter of metal electrode surface. A more preferred solder composition is about palladium, 31 mg, and silver 54 mg. per square centimeter of tungsten electrode.

In another embodiment, the present invention relates to an improved method for the permanent bonding of a tungsten electrode to a rough cut and unmodified silicon surface with a solder, which method comprises:

(1) contacting the rough cut silicon surface in an inert atmosphere at between about 800° and 1300° C. with a tungsten electrode wherein the surface of the tungsten electrode comprises a solder surface layer, itself comprising between about 24.8 and 37.2 mg of the palladium and between about 43.2 and 64.8 mg of silver per square centimeter of the surface of the tungsten electrode;

(2) creating a solid silicon-solder-tungsten contact; and (3) cooling the contact in inert atmosphere to ambient temperature.

It is an object of the present invention to enable the accurate and permanent bonding of a semiconductor material and a metal electrode using a particular solder mixture.

Another object of the present invention is to enable the accurate and permanent bonding of a rough cut semiconductor material such as silicon and a metal electrode such as tungsten using a novel solder composition comprising palladium and silver.

DETAILED DESCRIPTION OF THE INVENTION AND PREFERRED EMBODIMENTS

Figure 1:
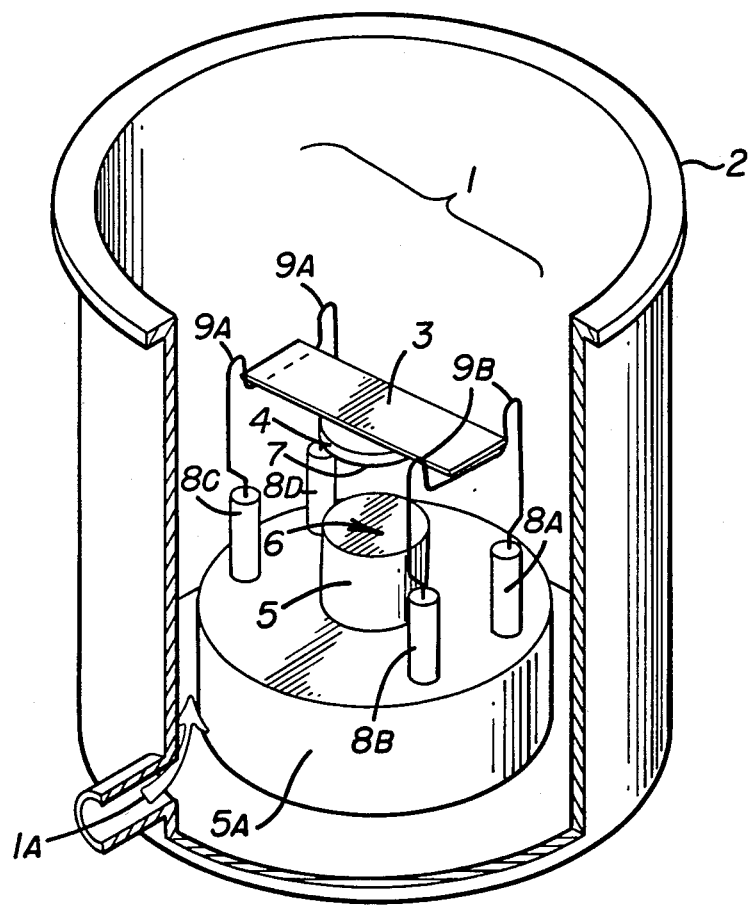
FIG. 1 shows a perspective view of the apparatus used to produce the metal-semiconductor contact of the present invention.

The process to prepare the metal-solder-semiconductor contact is described with reference to FIG. 1. The apparatus 1 is placed within a PYREX glass vessel 2 in which inert gas such as helium, neon, argon, xenon or mixtures thereof (shown as the arrow) may flow through the chamber. Vessel 2 may be of any size or shape similar to the one shown.

On anode 3 rests the column of a transferred direct current arc, which is the heat source for the alloying process. This anode 3 consists of a rectangular tungsten strip which is about 14 mm long, 5.5 mm wide and 0.15 mm thick. Electrode 4, used for the formation of the desired contact, is generally made of a circular tungsten disc, having a diameter of about 5 mm, and a thickness of about 0.6 mm. It is bonded by means of palladium to anode 3 and has a fiber structure with the direction of the fiber perpendicular to surface 7. This lower surface 7 is coated with an admixture of 31 mg ±20% palladium and 54 mg ±20% of silver per square centimeter of surface at least 1232°±20° C., after disc 4 is bonded to strip 3. Silicon substrate 5 is, for example, a cylindrical bar of monocrystalline silicon having an upper surface area 6 which contacts lower electrode surface area 7. The surface 6 usually has a diameter of between 4 and 5 mm and silicon substrate 5 is several mm high.

Conducting wires 9A and 9B serve as supports for tungsten strip 3. These wires are isolated electrically from silicon base 5 by means of ceramic tubes 8A, 8B, 8C and 8D. The solder coated side 7 of the electrode is brought in contact with upper surface 6 of the semiconductor where the soldered contact is to be formed. By means of a transferred arc or another means anode 3 is heated from above in an inert atmosphere until alloying is observed along the whole of the circumference of surface 6 and surface 7. Once alloyed, cooling of the article is started at the silicon 5 side of the contact and the contact is allowed to cool to about ambient temperature. This cooling must be done in a controlled manner or the newly formed contact will crack because of thermal stresses. The cooling usually occurs within about one to five minutes. About two minutes is a preferred time.

Rather than removing the saw damaged layer at the surface of the semiconductor substrate and removing the native oxide layer on the contact area before forming the contact, this oxide layer is dissolved by the alloying process. This same process with the quantities specified below for the coating of the tungsten electrode removes a surface layer of the semiconductor substrate at a thickness of the order of 35 micrometers. This removed material is incorporated into the interface region which forms between the silicon and the tungsten electrode.

T. S. Kuan, et al., in the Journal of the Electrochemical Society, Vol. 127, No. 6, p. 1387 ff published in 1980, disclose a study of the surface defect density, caused by a saw cutting, of a silicon substrate. The number of defects decreases very rapidly with depth and reaches a substantially low defect density at about 35 micrometers. This reference, and particularly FIG. 4, is hereby incorporated by reference.

The palladium-silver solder is coated onto the surface of the tungsten electrode surface at a temperature of between about 1200° and about 1300° C., preferred is 1232° C.±20° C. The coating process is performed quickly, in a few seconds, to prevent the tungsten electrode from recrystallizing at the elevated temperature. Recrystallization consists of grain growth which starts at about 1150° C. or higher due to a slow diffusion process. This recrystallization is to be avoided because the recrystallized tungsten electrode is undesirably brittle.

The surface of the substrate in the contact area develops according to the (111) planes. Therefore, the process of the present invention for contact formation is especially suited for the situation in which the substrate is monocrystalline, and where the (111) plane is parallel to the contact plane. In this case the surface of the substrate after formation of the contact is optimally flat.

To insure the cooling of the silicon-solder-tungsten contact, heat conduction is imposed through the silicon and heating is provided from the tungsten side of the contact. When the heating is reduced the heat conduction is effective at the silicon side of the contact, and the contact cools in a temperature gradient where the temperature is falling from the tungsten side to the silicon side of the contact and where it continues to fall in the silicon. The rate of cooling of the contact must not exceed 500° C./min. Otherwise, the silicon cracks near the contact junction.

It has been found generally that palladium alone (without silver) produces a contact between a tungsten electrode and a silicon surface which does not resist thermal stress and the contact opens on the silicon side of the contact when the device is cooled. The addition however of silver in the interface zone in the specified quantities eliminates contact opening.

As the silver content of the solder is reduced below the given limits, there is a higher probability for the silicon surface to crack near the interface area, even though the cooling rate is as stated or even slower.

When the silver content of the solder is at a level of about 27 mg per sq. centimeter of tungsten electrode, the contact still does not open (due to crack formation and propagation). However, the silicon material frequently (but not always) exhibits fine superficial cracks in the area of the interface zone.

It appears on the basis of scanning electron microscope studies coupled with an x-ray analyzer that the main component of the solder which dissolves the damaged rough cut silicon layer, is palladium. Consequently, the higher the palladium content of the palladium-silver solder the deeper the damaged silicon surface will be removed by the present method.

The following example is intended to be exemplary only and is not intended to be limiting in any way.

EXAMPLE 1

(a) In a typical procedure to create the silicon-solder-tungsten contact, the height of wires 9A and 9B are adjusted in such a way that the tungsten disc at any point on 6 makes contact with surface 7 and the tungsten strip rests on wire 9A but not on wire 9B. The height of tungsten strip 3 is adjusted in a way that allows surface 7 to come down on surface 6 as the alloying at elevated temperature is occurring.

Tungsten strip 3 is heated from above by means of a transferred direct current arc while the contact zone is observed using some magnification. When the actual junction contact between surface 6 and surface 7 takes place at (1024°±20)° C., disc 4 will come down until tungsten strip 3 rests on both wires 9A and 9B. The heating is continued for a few seconds for surfaces 6 and 7 now formed until the alloy (contact formation) is observed about the entire circumference of surfaces 6 and 7. It may not be necessary to measure the temperature of alloying of surfaces 6 and 7 in those cases wherein the alloying process at elevated temperature is observed visually.

(b) For samples of silicon 5, small size contacts without crack formation at the silicon side 5 have been obtained by inverting the arrangement in FIG. 1. This is to say, strip 3 rests on an electrical heater or is heated from below by some other means, surface 7 is looking upwards and silicon substrate 5 is made to rest with its surface 6 on surface 7. When electrode 4 at surface 7 reaches the above cited temperature, surface 6 comes down to form the contact.

Cooling of the contact of surfaces 6 and 7 is performed in the way described above. In this case, the silicon is cooled by convection in the inert gas stream, and the gas flow rate is kept low.

In other words, the silicon side of the contact is cooled at a rate of less than about 500° C./min. In a more preferred embodiment the rate of cooling is between about 250° and 330° C. per minute. In a preferred embodiment, argon gas is used preferably at a rate of between about 2.5 and 4.2 liters per minute.

While only a few embodiments of the present invention have been shown and described herein, it will be apparent to those skilled in the art that various modifications and changes can be made in the process of joining a rough cut semiconductor material with a metal electrode using a solder comprising palladium and silver without departing from the spirit and scope of the present invention. All such modifications and changes coming within the scope of the appended claims are intended to be covered thereby.

What is claimed is:

1. A method for the permanent bonding of a metal electrode to a rough cut and unmodified semiconductor material with a solder, which method comprises:
(a) contact the surface
   (i) of the semiconductor material, in an inert atmosphere at between about 800° and 1300° C. wherein the surface of the semiconductor material is rough cut and is not subsequently treated further, with
   (ii) a metal electrode wherein the surface of said metal electrode comprises
   (iii) a solder admixture alloyed on the surface of the metal electrode at between about 1000° and 1500° C. itself comprising between about 11 to 89 percent by weight of palladium and about 11 to 89 percent by weight of silver; and
(b) the soldered joint contacting the metal electrode and semiconductor material is then cooled from the semiconductor material side of the contact in inert atmosphere to ambient temperature.

2. The method of claim 1 wherein the inert atmosphere is a gaseous atmosphere selected from helium, neon, argon, xenon, nitrogen or mixtures thereof.

3. The method of claim 2 wherein the inert atmosphere is argon.

4. The method of claim 1 wherein the elevated temperature in step (a)(i) is between about 1000° and 1100° C.

5. The method of claim 4 wherein the semiconductor material is silicon, the metal electrode is tungsten, the elevated temperature of the electrode and the solder mixture is between about 1000° and 1050° C. and the inert atmosphere is argon.

6. The method of claim 5 wherein the temperature is about 1024° C.±20° C.

7. The method of claim 1 wherein the palladium to silver content in the solder is between about 24.8 and 37.2 mg of palladium and between about 43.2 and 64.8 mg of silver per square centimeter of metal.

8. The method of claim 1 wherein the palladium and silver are present in 31 mg of palladium and 54 mg of silver per square centimeter of metal surface.

9. The semiconductor surface solder-metal electrode device of claim 1.

10. A method for the permanent bonding of a tungsten electrode surface to a rough-cut and unmodified silicon surface with a solder, which method comprises:
(a) contacting the rough-cut silicon surface in an inert atmosphere at between about 800° and 1300° C. with a tungsten electrode surface wherein said tungsten electrode surface comprises a solder surface layer itself comprising between about 24.8 and 37.2 mg of palladium and between about 43.2 and 64.8 mg of silver per square centimeter of the surface of the tungsten electrode;
(b) creating a solid silicon-solder-tungsten contact; and
(c) cooling the contact in an inert atmosphere to ambient temperature.

11. The method of claim 10 wherein the inert atmosphere is a gaseous atmosphere selected from helium, neon, argon, xenon, nitrogen or mixtures thereof.

12. The method of claim 11 wherein the inert atmosphere is argon.

13. The method of claim 12 wherein the elevated temperature in step (a) is between about 1000° and 1100° C.

14. The method of claim 12 wherein the elevated temperature is about 1024° C.±20° C.

15. The method of claim 14 wherein the palladium and silver content is about 31 mg of palladium and 54 mg of silver per square centimeter of surface.

16. The method of claim 10 wherein in step (a) the palladium-silver content is between about 24.8 and 37.2 mg of palladium and between about 43.2 and 64.8 mg of silver per square centimeter of tungsten electrode surface.

17. The method of claim 12 wherein the elevated temperture in step (a) is between about 800° and 1300°.

* * * * *